United States Patent
Zang et al.

(10) Patent No.: US 10,128,052 B1
(45) Date of Patent: Nov. 13, 2018

(54) METHODS OF THERMALLY INDUCED RECRYSTALLIZATION

(71) Applicant: University of Utah Research Foundation, Salt Lake City, UT (US)

(72) Inventors: Ling Zang, Salt Lake City, UT (US); Daniel Jacobs, Salt Lake City, UT (US)

(73) Assignee: University of Utah Research Foundation, Salt Lake City, UT (US)

(*) Notice: Subject to any disclaimer, the term of this patent is extended or adjusted under 35 U.S.C. 154(b) by 0 days.

(21) Appl. No.: 15/668,688

(22) Filed: Aug. 3, 2017

(51) Int. Cl.
*H01L 21/00* (2006.01)
*H01G 9/00* (2006.01)
(Continued)

(52) U.S. Cl.
CPC ......... *H01G 9/0036* (2013.01); *H01G 9/2009* (2013.01); *H01L 51/0077* (2013.01); *H01L 51/4246* (2013.01); *H01L 2251/10* (2013.01)

(58) Field of Classification Search
CPC ............ H01L 51/0077; H01L 51/4246; H01G 9/0036; H01G 9/2009
See application file for complete search history.

(56) References Cited

U.S. PATENT DOCUMENTS

| | | |
|---|---|---|
| 9,570,240 B1 | 2/2017 | Durstock et al. |
| 2014/0134823 A1 | 5/2014 | Hendrix et al. |

(Continued)

FOREIGN PATENT DOCUMENTS

| | | |
|---|---|---|
| CN | 105024012 | 11/2015 |
| WO | WO2016/105537 A1 | 6/2016 |
| WO | WO2017/087611 A1 | 5/2017 |

OTHER PUBLICATIONS

Chang et al.; "$CH_3NH_2$ Gas Induced (110) Preferred Cesium Containing Perovskite Films with Reduced $PbI_6$ Octahedron Distortion and Enhanced Moisture Stability." Journal of Materials Chemistry A; Royal Society of Chemistry; Feb. 10, 2017; vol. 5, Issue 10; pp. 4803-4808.

(Continued)

*Primary Examiner* — Richard Booth
(74) *Attorney, Agent, or Firm* — Thorpe North & Western, LLP (57) ABSTRACT

A method for thermally induced recrystallization of a film having a perovskite structure can include exposing the perovskite structure to a liquid phase induction atmosphere sufficient to at least partially liquefy the film. The substrate with the film can be heated while in the atmosphere to a heating temperature above a critical recrystallization temperature until the film recrystallizes to reform the perovskite structure with reduced defects and increased grain size. The liquid phase induction atmosphere can be purged, and the substrate with the film having the reformed perovskite structure can be allowed to cool. The film having the perovskite structure can have a formula $ABX_3$, $(RA)_2A_{n-1}B_nX_{3n+1}$, or $(RA_2)A_{n-1}B_nX_{3n+1}$, where A is a monovalent cation, B is divalent metal cation, n is an integer, X is a halide ion, RA is an alkylammonium cation and $RA_2$ is an alkyldiammonium cation.

21 Claims, 8 Drawing Sheets

(51) Int. Cl.
*H01L 51/00* (2006.01)
*H01G 9/20* (2006.01)
*H01L 51/42* (2006.01)

(56) References Cited

U.S. PATENT DOCUMENTS

| | | |
|---|---|---|
| 2016/0251303 A1 | 9/2016 | Moore et al. |
| 2016/0254472 A1* | 9/2016 | Wang .................... H01L 51/424 136/263 |
| 2017/0084399 A1* | 3/2017 | Vak ..................... H01L 51/0004 |
| 2017/0098514 A1 | 4/2017 | Geohegan et al. |
| 2017/0152608 A1* | 6/2017 | Jin ............................ C30B 7/14 |

OTHER PUBLICATIONS

Conings et al.; "Structure-Property Relations of Methylamine Vapor Treated Hybrid Perovskite $Ch_3NH_3PbI_3$ Films and Solar Cells." Applied Materials and Interfaces; ACS; Feb. 10, 2017; vol. 9, Issue 9; pp. 8092-8099.

Jacobs et al.; "Thermally Induced Recrystallization of $MAPbI_3$ Perovskite Under Methylamine Atmosphere: An Approach to Fabricating Large Uniform Crystalline Grains." Chem Commun; The Royal Society of Chemistry; Aug. 3, 2016; vol. 52, Issue 71; pp. 10743-10746.

Jiang et al.; "Post-Annealing of $MAPbI_3$ Perovskite Films with Methylamine for Efficient Perovskite Solar Cells." Materials Horizons; Royal Society of Chemistry; Aug. 5, 2016; vol. 3, Issue 6; pp. 548-555.

Pang et al.; "Transformative Evolution of Organolead Triiodide Perovskite Thin Films from Strong Room-Temperature Solid-Gas Interaction Between $HPbI_3$-$CH_3NH_2$ Precursor Pair." Journal of American Chemical Society; Jan. 5, 2015; vol. 138, Issue 3; pp. 750-753.

Raga et al.; "Rapid Perovskite Formation by $CH_3NH_2$ Gas induced Intercalation and Reaction of $PbI_2$." Journal of Materials Chemistry A; Royal Society of Chemistry; Dec. 21, 2015; vol. 4, Issue 71; pp. 2494-2500.

Xiao et al.; "Thin-Film Semiconductor Perspective of Organometal Trihalide Perovskite Materials for High-Efficiency Solar Cells." Materials Science and Engineering R: Reports; Elsevier; Mar. 2016; vol. 101; pp. 1-38.

Zhang et al.; "Carrier Transport Improvement of $CH_3NH_3PbI_3$ Film by Methylamine Gas Treatment." Applied Materials and Interfaces; ACS; Oct. 31, 2016; vol. 8, Issue 45; pp. 31413-31418.

Zhao et al.; "Design Rules for the Broad Application of Fast (<1 S) Methylamine Vapor Based, Hybrid Perovskite Post Deposition Treatments." RSC Advances; Royal Society of Chemistry; Mar. 10, 2016; vol. 6, Issue 33; pp. 27475-27484.

Zhou et al.; "Methylamine-Gas-Induced Defect-Healing Behavior of $CH_3NH_3PbI_3$ Thin Films for Perovskite Solar Cells." Angewandte Chemie; Wiley Online Library; Aug. 10, 2015; vol. 54, Issue 33; pp. 9705-9709.

Zhou et al.; "Exceptional Morphology-Preserving Evolution of Formamidinium Lead Triiodide Perovskite Thin Films via Organic-Cation Displacement." JACS; Apr. 18, 2016; vol. 138, Issue 17; pp. 5535-5538.

* cited by examiner

METHODS OF THERMALLY INDUCED RECRYSTALLIZATION

BACKGROUND

Figure 1:
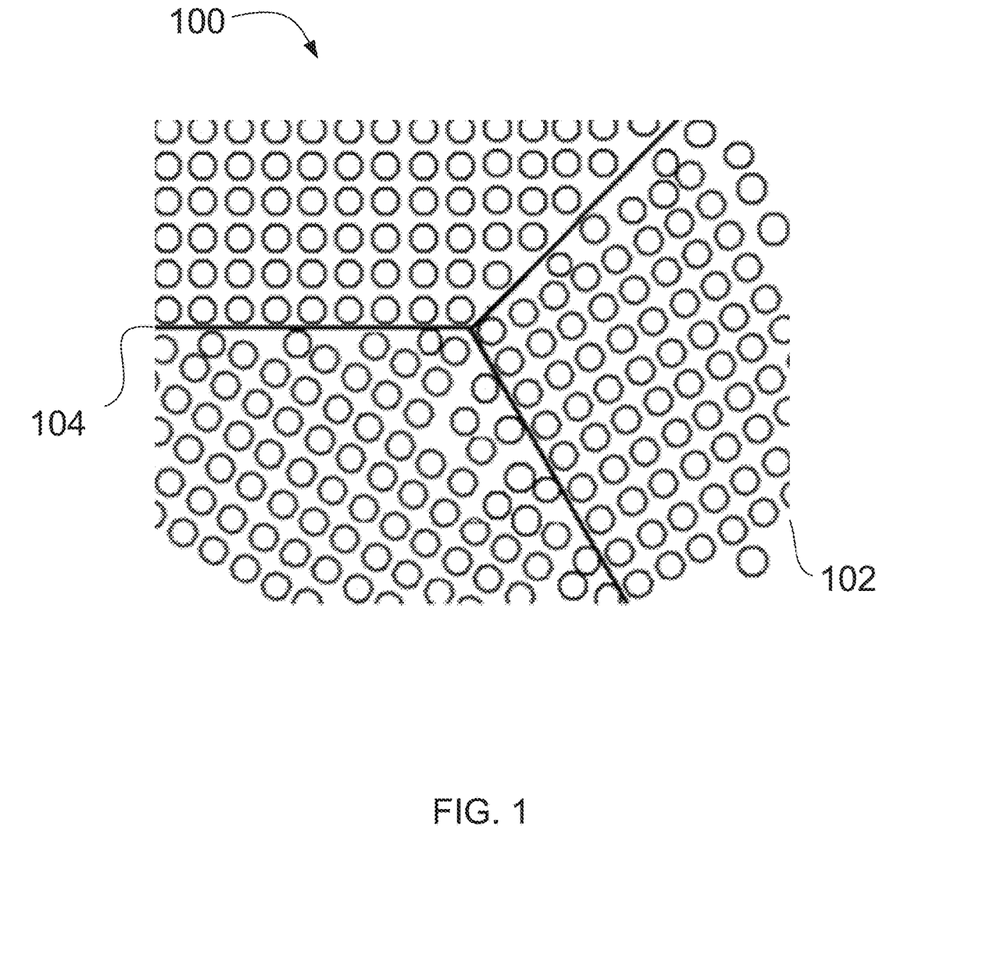
FIG. 1 schematically depicts a crystalline structure exhibiting lattice mismatch at grain boundaries.

In the last ten years the performance of perovskite materials has increased from 3% to 22.1% reaching the efficiencies of other thin film technologies. In addition the materials utilized to form perovskite films are generally inexpensive earth abundant materials and perovskite films can be processed using low temperature solution based techniques, which makes the materials for perovskite films inexpensive to manufacture. However manufacturing high quality versions of these films can create challenges. Specifically, controlling the deposition and crystallization of these films can be challenging in a reliable and reproducible manner during the creation of large area uniform thin perovskite films. Early devices were fabricated using spin coating deposition followed by thermal annealing to form a crystalline film. However, perovskite films created using this method generally suffered from large and non-uniform crystal grains that have been attributed to fast crystal growth kinetics. In addition these films can also exhibit pinhole defects which can limit performance efficiencies. Various other deposition techniques have been developed to counteract these challenges including, 2-step deposition methods, anti-solvent methods, and hot casting methods. While these techniques can increase the nucleation kinetics of the crystals during crystallization, they can result in small uniform crystal grains across (200-500 nm), lattice mismatch, and increased grain boundary area between crystals which can limit performance. FIG. 1 depicts a crystalline film 100 with grains 102 and lattice mismatch at grain boundaries 104. Grain boundaries are believed to serve as a site for recombination loss and a pathway for ion migration of mobile charged defects which can reduce the performance over time and lead to material degradation in these films. While post deposition techniques have been developed to increase grain size, such as thermal or solvent annealing, the resulting grains are typically less than an order of magnitude in increase, e.g. a micron or less. Thus methods to fabricate large and uniform areas of larger crystal grains across the surface of a substrate would be an improvement in the art.

SUMMARY

A method for thermally induced recrystallization of a film having a perovskite structure can include exposing the substrate with the film having the perovskite structure to a gaseous liquid phase induction atmosphere sufficient to at least partially convert the film to a liquid phase. The film has the structure $ABX_3$, $(RA)_2A_{n-1}B_nX_{3n+1}$, or $(RA_2)A_{n-1}B_nX_{3n+1}$ where A is a monovalent cation, B is divalent metal cation, n is an integer greater than or equal to 1, X is a halide ion, and RA is an alkylammonium, and $RA_2$ is an alkyldiammonium compound. The substrate with the film can be heated while in the gaseous atmosphere to a heating temperature above a critical temperature of the film until the film recrystallizes to reform the perovskite structure with reduced defects and increased grain size. Subsequently, the substrate with the film having the reformed perovskite structure can be allowed to cool.

In one example the method can further optionally include purging oxygen from the atmosphere prior to the exposing of the substrate with the film having the perovskite structure to the gaseous atmosphere. In some examples the purging can include pumping nitrogen into the atmosphere for at least 3 minutes. In yet other examples the method can further include purging the gaseous atmosphere prior to the allowing of the substrate with the film having the reformed perovskite structure to cool. In yet another example the film having the perovskite structure is methylammonium lead triiodide ($MAPbI_3$) and the gaseous atmosphere comprises methylamine gas.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

These figures illustrate various aspects of the invention and are not intended to be limiting of the scope in terms of dimensions, materials, configurations, arrangements or proportions unless otherwise limited by the claims.

DETAILED DESCRIPTION

While these exemplary embodiments are described in sufficient detail to enable those skilled in the art to practice the invention, it should be understood that other embodiments may be realized and that various changes to the invention may be made without departing from the spirit and scope of the present invention. Thus, the following more detailed description of the embodiments of the present invention is not intended to limit the scope of the invention, as claimed, but is presented for purposes of illustration only and not limitation to describe the features and characteristics of the present invention, to set forth the best mode of operation of the invention, and to sufficiently enable one skilled in the art to practice the invention. Accordingly, the scope of the present invention is to be defined solely by the appended claims.

Definitions

In describing and claiming the present invention, the following terminology will be used.

The singular forms "a," "an," and "the" include plural referents unless the context clearly dictates otherwise. Thus, for example, reference to "an ion" includes reference to one or more of such materials and reference to "heating" refers to one or more such steps.

As used herein, the terms "about" and "approximately" are used to provide flexibility, such as to indicate, for example, that a given value in a numerical range endpoint may be "a little above" or "a little below" the endpoint. The degree of flexibility for a particular variable can be readily determined by one skilled in the art based on the context. However, unless otherwise enunciated, the term "about" generally connotes flexibility of less than 5%, and most often less than 1%, and in some cases less than 0.01%.

In this disclosure, "comprises," "comprising," "comprised," "containing" and "having" and the like can have the meaning ascribed to them in U.S. Patent law and can mean "includes," "including," and the like, and are generally interpreted to be open ended terms. The term "consisting of" is a closed term, and includes only the devices, methods, compositions, components, structures, steps, or the like specifically listed, and that which is in accordance with U.S. Patent law. "Consisting essentially of" or "consists essentially" or the like, when applied to devices, methods, compositions, components, structures, steps, or the like encompassed by the present disclosure, refers to elements like those disclosed herein, but which may contain additional structural groups, composition components, method steps, etc. Such additional devices, methods, compositions, components, structures, steps, or the like, etc., however, do not materially affect the basic and novel characteristic(s) of the devices, compositions, methods, etc., compared to those of the corresponding devices, compositions, methods, etc., disclosed herein. In further detail, "consisting essentially of" or "consists essentially" or the like, when applied to devices, methods, compositions, components, structures, steps, or the like encompassed by the present disclosure have the meaning ascribed in U.S. Patent law and the term is open-ended, allowing for the presence of more than that which is recited so long as basic or novel characteristics of that which is recited is not changed by the presence of more than that which is recited, but excludes prior art embodiments. In this specification when using an open ended term, like "comprising" or "including," it is understood that direct support should be afforded also to "consisting essentially of" language as well as "consisting of" language as if stated explicitly and vice versa.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

As used herein, the term "at least one of" is intended to be synonymous with "one or more of." For example, "at least one of A, B and C" explicitly includes only A, only B, only C, and combinations of each.

Any steps recited in any method or process claims may be executed in any order and are not limited to the order presented in the claims. Means-plus-function or step-plus-function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the invention should be determined solely by the appended claims and their legal equivalents, rather than by the descriptions and examples given herein.

Figure 2:
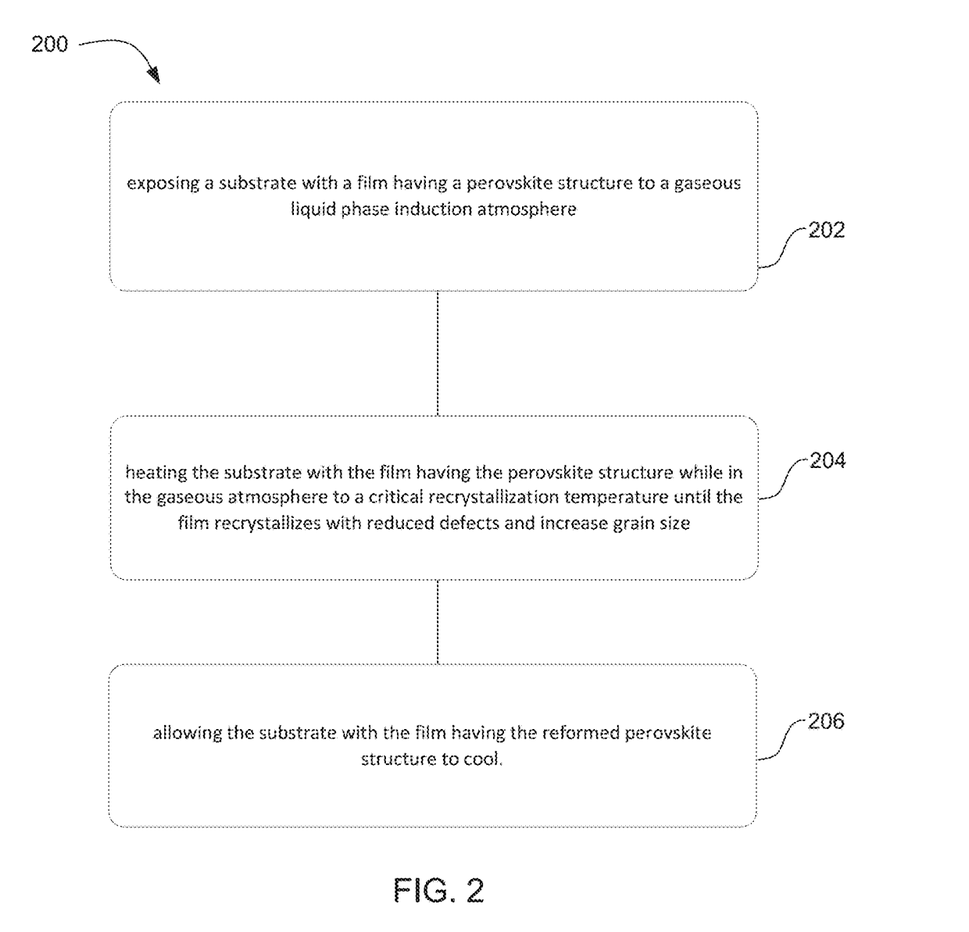
FIG. 2 is a process flow diagram for thermally induced recrystallization in accordance with one example presented herein.

Referring now to FIG. 2, a method 200 of thermally induced recrystallization of a film having a perovskite structure can include exposing a substrate with a film having a perovskite structure to a gaseous liquid phase induction atmosphere 202. Typically, this can be performed at an initial starting temperature in which the film is a liquid and in which the film would be a solid in the absence of the liquid phase induction atmosphere. Furthermore, the exposure can also occur in a controlled environment such as in a sealed chamber, continuous flow chamber, or other similar controllable atmosphere enclosure. The film having the perovskite structure can then be heated while in the gaseous atmosphere to a heating temperature above a critical temperature of the film until the film having the perovskite structure recrystallizes 204 as a reformed perovskite structure. The reformed perovskite can exhibit markedly reduced defects and increased grain size. Subsequently, the reformed perovskite structure can be allowed to cool 206. The film has the formula $ABX_3$, $(RA)_2A_{n-1}B_nX_{3n+1}$, or $(RA_2)A_{n-1}B_nX_{3n+1}$ where A is a monovalent cation, B is divalent metal cation, n is an integer, X is a halide ion, and $RA$ is an alkylammonium cation, and $RA_2$ is an alkyldiammonium cation.

The methods presented herein are post deposition treatments such that the perovskite film can be deposited or formed in any manner. Thus, the substrate and perovskite film are not particularly limited. The method is also not dependent on the type of substrate. Thus, the substrate can be any surface capable of supporting the film having a perovskite structure. For example the substrate can be, but is not limited to be, glass, treated glass, metal foil, polymer, ceramic, semiconductor, silicon solar cell, composites thereof, or a combination thereof. In one example the substrate can be glass. The glass substrates can be treated. Exemplary treated glass substrates can include quartz coated glass, molybdenum coated glass, tin-doped indium oxide (ITO) glass, fluorine doped tin oxide (FTO) glass, and the like. In other examples the substrate can be a ceramic and the ceramic can be silica, silicon nitride, silicon carbide, sapphire, zirconia, yttria, alumina, aluminum nitride, cermet, cordierite, mulilite, steatite, forsterite, or a combination thereof. In other examples, the substrate can be flexible substrates. Exemplary flexible substrates can include flexible polyethylene terephthalate (PET) sheets, polycarbonate, silicone, aluminum foil, steel foil, flexible glass sheets, and the like. In yet other examples the substrate can be coated. Exemplary coatings can include quartz, titanium dioxide, 2,2',7,7'-Tetrakis[N,N-di(4-methoxyphenyl)amino]-9,9'-spirobifluorene (Spiro-OMeTAD), poly(3,4-thylenedioxythiophene):polystyrenesulfonate (PEDOT:PSS), poly(3-hexylthiophene) (P3HT), fullerene ($C_{60}$), carbon nanotubes, graphite, graphene, poly(methyl methacrylate) (PMMA), nickel oxide, tin oxide, zinc oxide, copper oxide, and the like.

Figure 3:
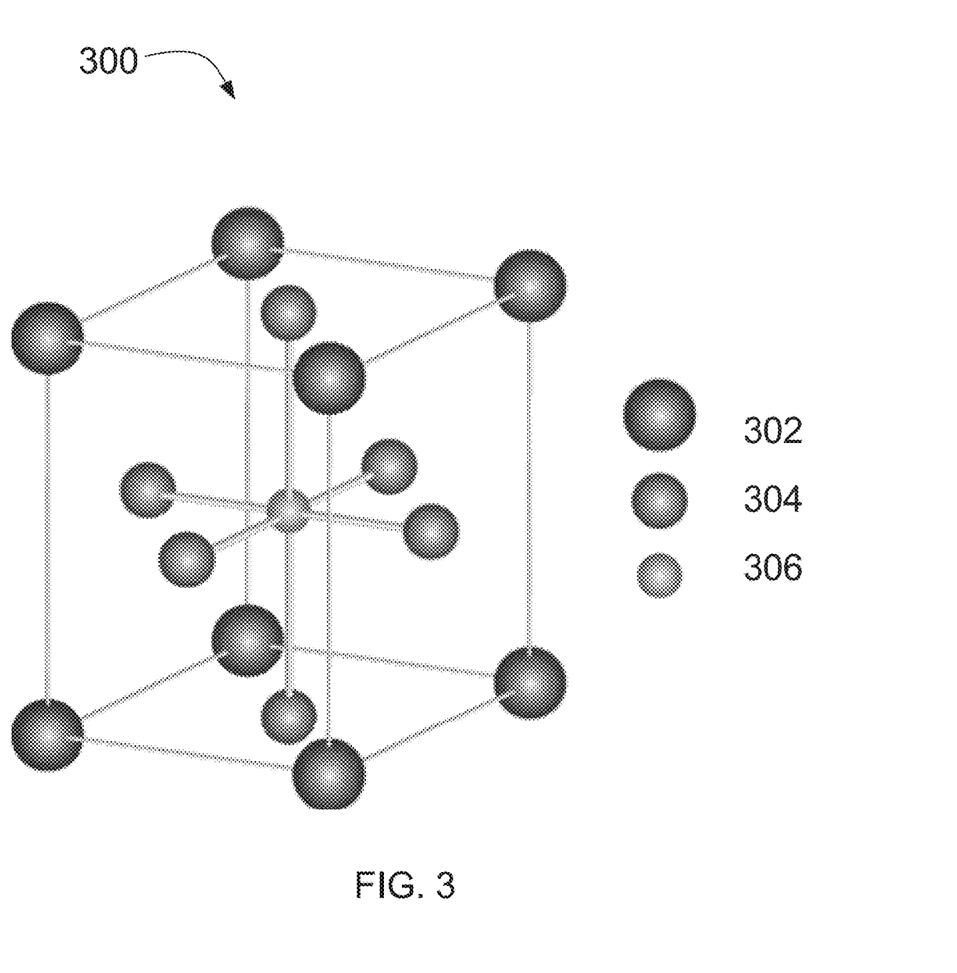
FIG. 3 schematically illustrates a portion of a crystal structure of perovskite.

Likewise the film having the perovskite structure is also not particularly limited so long as, the film has a perovskite structure, e.g. the film satisfies formula I, formula II or formula III.

$$ABX_3 \tag{I}$$

$$(RA)_2A_{n-1}B_nX_{3n+1}, \tag{II}$$

$$(RA_2)A_{n-1}B_nX_{3n+1} \tag{III}$$

where A can be a monovalent cation, B can be a divalent metal cation, n can be an integer (e.g. 1 or 2), X can be a halide ion, and RA is an alkylammonium or alkyldiammonium. Perovskite structures can be cubic or pseudo-cubic, crystalline structures. B and X can form ionic bonds and can create a lattice cage. A can reside within the lattice cage and can be stabilized in the cage by hydrogen bonds. A portion of a crystal structure 300 having a perovskite structure can have a layout that can include A 302, B 304, and X 306, as shown in FIG. 3.

As previously stated, A can be a monovalent cation. A-site substitutions can form three-dimensional perovskites with A-sites including, but not limited to, methylammonium (MA), Cesium (Cs), Formamadinium (FA), Rubidium (Rb), and mixtures thereof. Two-dimensional perovskites can also be formed using alkylammonium compounds as the cation. Non-limiting examples of such cations can include butylammonium (BA), phenylethylammonium (PEA), cyclopropylammonium (CA), as well as the mixed Rudlesden-Popper 2D/3D phases of the formula II with RA being an alkylammonium group. Furthermore, two-dimensional perovskites can also be formed using alkyldiammonium compounds. Suitable such cations can include, but are not limited to, butyldiammonium ($BA_2$), hexyldiammonium ($HA_2$), octyldiamonium ($OA_2$), dodecanediammonium ($DDA_2$), and the Ruddlesden-Popper 2D/3D mixtures of the formula III where $RA_2$ is the alkyldiammonium group.

The B can be a divalent metal cation. Non-limiting examples of suitable divalent metal cations can include lead (Pb), tin (Sn), bismuth (Bi), antimony (Sb), silver (Ag), strontium (Sr), calcium (Ca), cadmium (Cd), magnesium (Mg), manganese (Mn), nickel (Ni), and combinations thereof. Additional examples of suitable divalent metal cations can include $Be^{2+}$, $Ba^{2+}$, $Ra^{2+}$, $Hg^{2+}$, $Fe^{2+}$, $Cr^{2+}$, $Pd^{2+}$, $Pt^{2+}$, $Zn^{2+}$, $Cd^{2+}$, and $Hg^{2+}$.

The X can be a halide ion such as, but not limited to, iodide (I), bromide (Br), chloride (Cl), Fluoride (F), pseudohalide thiocyanate (SCN), and combinations thereof.

In some examples the film having a perovskite structure can be methyl ammonium lead triiodide ($MAPbI_3$), and the like. In one example the film having a perovskite structure can be methyl ammonium lead triiodide.

In some examples, the film having the perovskite structure can be a hybrid halide perovskite. As used herein a "hybrid halide perovskite" refers to the mixture of an organic A ionic compound and the inorganic B and X ions. The "halide" refers to the use of a halide at the X-site, including iodide (I), bromide (Br), and chloride (Cl), as well as pseudohalides including thiocyanate (SCN). Organic ionic compounds used in hybrid halide perovskite refers to ionic organic molecules containing a positive charge on one or more functional groups of an organic molecule at any site including, but not limited to, a carbon, nitrogen, sulfur, or phosphorus site. Exemplary A-site organic ionic compounds include, but are not limited to, methylammonium (MA), Formamadinium (FA), butylammonium (BA), phenylethylammonium (PEA), cyclopropylammonium (CA), and ammonium ($NH_3$), and the like. Hybrid halide perovskites also refers to perovskites of the 2D, 3D, or Ruddlesden-Popper 2D/3D phase as long as the mixture of A-site compounds includes organic A-site ions. The hybrid halide perovskite can be, but is not limited to, methylammonium metal halide ($MABX_3$), formamadiunium metal halide ($FABX_3$), Butylammonium metal halide (($BA)_2BX_4$), butyldiammonium metal halide ($BA_2)BX_4$, Ruddlesden-Popper 2D/3D butylammonium methylammonium metal halide (($BA)_2(MA)_{1-n}B_nX_{3n+1}$ where n is an integer greater and 1, mixed organic/inorganic A-site cation perovskite cesium methylammonium metal halide ($MA_xCs_{(1-x)}PbI_3$), or any combination thereof. In one example the hybrid halide perovskite can be an organic-inorganic halide hybrid perovskite.

In some examples, the film having perovskite structure can be an all inorganic perovskite. As used herein an "inorganic halide perovskite" refers to perovskites where A, B, and X ions are inorganic compounds. Exemplary inorganic halide perovskites include cesium lead iodide ($CsPbI_3$), and Rubidium lead iodide ($RbPbI_3$).

Regardless of the substrate and the film having the perovskite structure, the method presented includes exposing the film having the perovskite structure to a gaseous liquid phase induction atmosphere. The liquid phase induction atmosphere can include a liquid phase inducing compound. Typically, the atmosphere can be held at a temperature close to room temperature. However, any temperature at which the film is a liquid when exposed to the liquid phase inducing compound can be suitable.

Furthermore, the gaseous liquid phase induction atmosphere can be maintained within a controlled environment. For example, a sealed chamber may be used. The chamber is not particularly limited so long as it can be sealed or controlled so as to prevent or reduce atmospheric gas exposure and allow for gas to be pumped in to the chamber or other controlled environment.

In one example the gaseous atmosphere that can be pumped in to the chamber including a suitable liquid phase inducing agent. Suitable liquid phase inducing agents can include, but are not limited to, methylamine, Cesium, Rubidium, Formamidine (FA), alkylamines, alkyldiamines, primary amine, and combinations thereof. For example, various gas or vapor sources may be used to induce the liquid intermediate phase as well as be used to incorporate into the final perovskite film (e.g. as A site substitutions). These potential vapors include, but are not limited to, Cesium (Cs), Rubidium (Rb), Formamidine ($FA^0$), alkylamines ($CH_3(CH_2)_nNH_2$ with n being an integer $\geq 1$), alkyldiamines ($NH_2(CH_2)_nNH_2$ with n being an integer $\geq 1$), or primary amine ($R-NH_2$) containing compounds such as cyclopropylamine ($CA^0$), phenethylamine ($PEA^0$), and the like. Mixtures of these different gases may also be used to form partially substituted perovskite phases including 3D, 2D, or Ruddlesden-Popper phases as previously described, by either sequential exposure to the film, or simultaneous exposure to the film and subsequent recrystallization. In one example the gaseous atmosphere can be head space of a solution of methylamine in ethanol. In other examples, the gaseous atmosphere can be the head space of a solution of methylamine in water. In yet other examples, the gaseous atmosphere can be pure methylamine gas. In yet other examples, the gaseous atmosphere can be the headspace from a pure liquid amine including butyl amine. As a general guideline, the liquid phase inducing agent can comprise from 20 to 100 vol % of the atmosphere, and often from 20 to 40%.

In some examples the gaseous liquid phase induction atmosphere can include a gas that can incorporate the same elements that appear in the perovskite structure. More specifically, the liquid phase inducing agent within the gaseous atmosphere can include a component which produces a cation which can be incorporated into the crystal lattice as an A substituent. In this instance the film having the perovskite structure can recrystallize to form a film having the same components when the recrystallized perovskite structure is formed. For example the gaseous liquid phase induction atmosphere can include a compound or component that can be the same as the A in the film having the perovskite structure.

In yet other examples the gaseous liquid phase induction atmosphere can include a gas that does not incorporate a compound which produces a cation having the same composition for the A position that appear in the perovskite structure. This can allow for A in the film having the perovskite structure to be substituted with a component from the gaseous atmosphere. For example exposing methylammonium lead triiodide ($MAPbI_3$) to a gaseous atmosphere of butylamine gas (BAO) can result in the formation of a recrystallized butylammonium lead triiodide film ($BAPbI_3$) or a hybrid $MAPbI_3/BAPbI_3$ film. In this example the A in the film having the perovskite structure, e.g. the methylamine, can be substituted with butylamine through gas-phase substitution and subsequent proton exchange. This can provide the ability to tune the structural, morphological, and optoelectronic properties of the recrystallized film having the perovskite structure and can result in a shift in the photoluminescence of the recrystallized film.

Thus, the gaseous liquid phase induction atmosphere can be used to fine tune a composition of the film having the perovskite structure. In some examples the gaseous atmosphere can include several vapor species. A multi-component vapor treatment can allow for the formation of a Ruddelsden-Popper 2-D/3-D hybrid structure. In yet other examples, the exposure to the gaseous atmosphere can allow for the film having the perovskite structure to be formed using methods that incorporate passivating agents and additives during formation that can subsequently be removed from the film during the recrystallization process. For example, the perovskite films may also utilize any defect passivating agent either before, during, or after the methods described herein. The passivating agent can be an element or molecule incorporated in the thin film via solution or vapor phase. The passivating agents serve to passivate defect states at the surface or grain boundary, or act to control the recrystallization growth mechanism, but do not incorporate into the crystal lattice. Passivating agents include, but are not limited to, fullerene, thiophene, pyridine, trioctylphosphine oxide, octadecanethiol, triphenylphosphine, hypophosphorous acid, aluminum ($Al^{3+}$), copper ($Cu^{1+}$), silver ($Ag^{1+}$), sodium ($Na^{1+}$), and potassium ($K^{1+}$).

An exposure period for the gaseous liquid phase induction atmosphere prior to heating can vary. However, in one example the gaseous atmosphere exposure period prior to heating ranges from 5 seconds to 5 minutes. In yet other examples the gaseous atmosphere exposure period prior to heating can range from 10 seconds to 3 minutes, 15 seconds to 4 minutes, 30 seconds to 5 minutes, 30 seconds to 3 minutes, or 30 seconds to 2 minutes. In another example the gaseous atmosphere exposure period prior to heating can be at least 5 seconds, at least 15 seconds, or at least 30 seconds.

The exposure can also be performed at a temperature at which the perovskite structure is normally stable in the absence of the liquid phase induction atmosphere. For example, initial exposure temperatures can range from about 0° C. to about 50° C., and often about 20° C. to 25° C.

Following the gaseous liquid phase induction atmosphere exposure period the film having at least a partial liquid phase can be heated while in the gaseous liquid phase induction atmosphere to a critical recrystallization temperature of the film having the perovskite structure until the film having the perovskite structure recrystallizes. This means that the critical recrystallization temperature is at least reached and may be exceeded as long as recrystallization is maintained. Heating the film having the at least partial liquid intermediate phase can reduce the interaction of the ionic perovskite film and the polar liquid inducing gaseous phase. When the substrate with the film having the perovskite reaches the critical temperature the film having the perovskite structure can then recrystallize to form a solidified film. The heating and recrystallization can occur while in the gaseous atmosphere. Furthermore, the heating and recrystallization can occur even without evaporation of any solvent or other material. Rather, recrystallization occurs merely by heating under the liquid phase induction atmosphere.

While the critical temperature can vary depending on a composition of the film having the perovskite structure, in one example, the critical recrystallization temperature can be at least 30° C. In yet other examples the critical recrystallization temperature can be at least 40° C., at least 50° C., at least 60° C., or at least 75° C. In yet other examples, the critical recrystallization temperature can range from 30° C. to 150° C., 50° C. to 100° C., or from 60° C. to 90° C.

A heating period can vary depending on the film having the perovskite structure. In general the heating period can be a period of time that allows for the film having the intermediate liquid phase to recrystallize to the solid perovskite phase. In some instances the heating can occur from 1 minutes to 60 minutes. In yet other examples the heating period can range from 2 to 5 minutes, or from 10 to 30 minutes.

When the solidified film is formed, the liquid inducing gas atmosphere about the film can be purged from the chamber containing the film while maintain the temperature above the critical temperature. In one example the method can further include purging atmospheric gas prior to exposing of the substrate with the film having the perovskite structure to the gaseous liquid phase induction atmosphere. In some examples the purging can include pumping nitrogen into the sealed chamber or atmosphere about the film. The purging gas can be pumped into the environment for at least 3 minutes, or at least 10 minutes. In other examples, the purging gas can be pumped into the environment for at least 30 minutes or at least 60 minutes.

When the solidified film is formed and purged of the liquid inducing gaseous environment, the substrate with the film having the reformed perovskite structure can be allowed to cool below the critical temperature. The structural changes that occurred during the recrystallization will remain following cooling. The resultant recrystallized film can typically have crystal grain sizes above 10 μm, above 20 μm, above 50 μm, above 100 μm, or above 200 μm. In yet other examples the resultant recrystallized film can have crystal grain sizes ranging from 10 μm to 50 μm, from 50 μm to 100 μm, or from 100 μm to 1000 μm. Typical starting grain sizes prior to recrystallization can range from 0.1 μm to 1 µm. Regardless of the starting grain size, grain size can typically be increased from 100 to 10,000%, and often from 100 to 1000%. The resultant recrystallized film can also provide a compact uniform film over a large area e.g. an area equal to or greater than 1 cm$^2$. In one example the substrate having the film with a perovskite structure can have a substrate area ranging from 1 cm$^2$ to 20 cm$^2$. In yet other examples, the substrate area can range from 2 cm$^2$ to 20 cm$^2$, or 200 cm$^2$. Specifically, substrate area is distinct from surface area which would be significantly higher as it includes surface topology and roughness.

Figure 4:
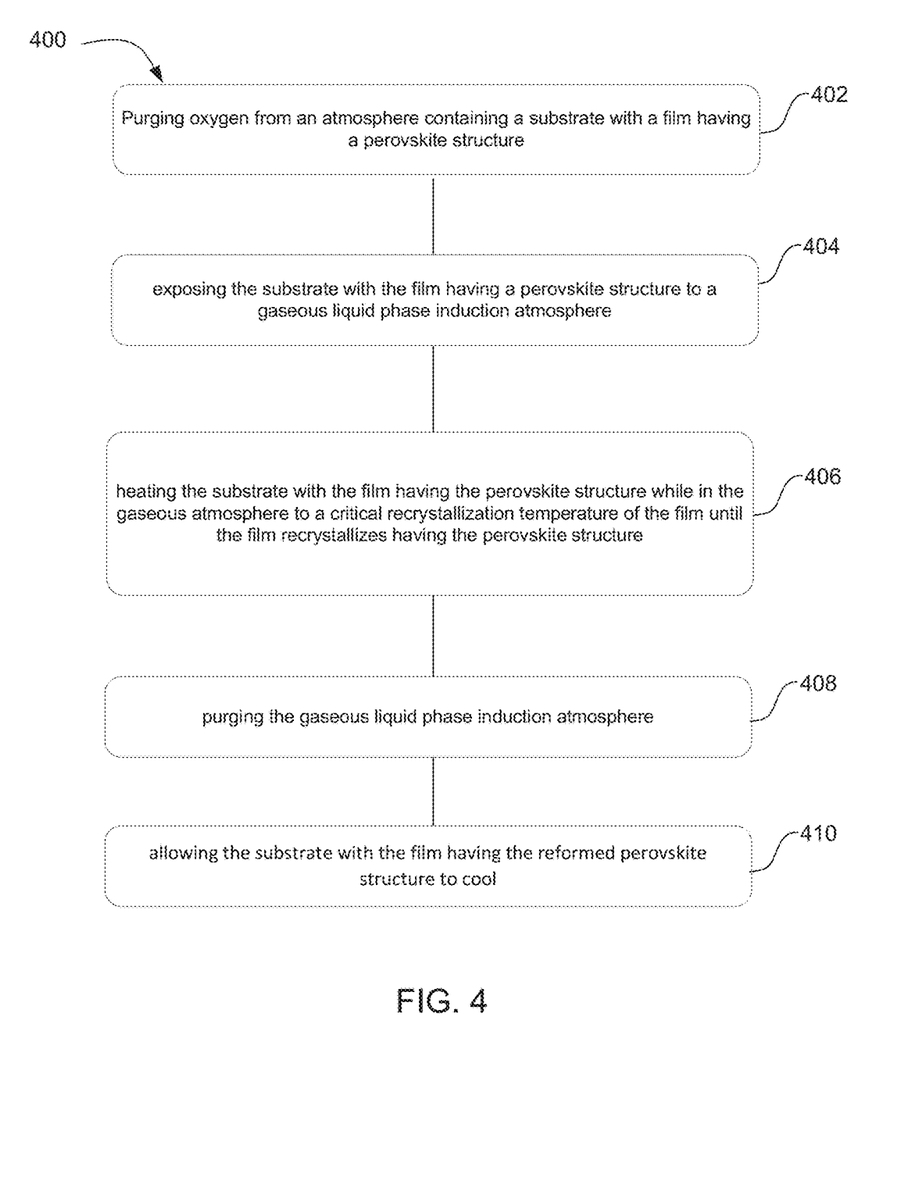
FIG. 4 is a process flow diagram for thermally induced recrystallization in accordance with one example presented herein.

As shown in FIG. 4, in some examples, the method can include purging the gaseous atmosphere before exposing the substrate with the film having a perovskite structure to a gaseous atmosphere and after heating. For example, the method 400 can include purging oxygen from a controlled environment containing a substrate with a film having a perovskite structure 402. The method can further include exposing the substrate with the film having the perovskite structure to a gaseous liquid phase induction atmosphere at a first temperature within a controlled atmosphere 404. The perovskite structure is at least partially converted to a liquid phase and in some cases fully converted to a liquid phase. The substrate with the film having at least a partial liquid phase can then be heated while in the gaseous atmosphere to a heating temperature at or above the critical recrystallization temperature of the film until the film having the perovskite structure recrystallizes 406. The gaseous atmosphere can then be purged from the controlled environment containing the substrate with the film having the perovskite structure 408. Finally, the substrate with the film having the reformed perovskite structure can be allowed to cool 410. Upon cooling, the film can return to room temperature or at least a temperature below the critical recrystallization temperature.

Figure 5:
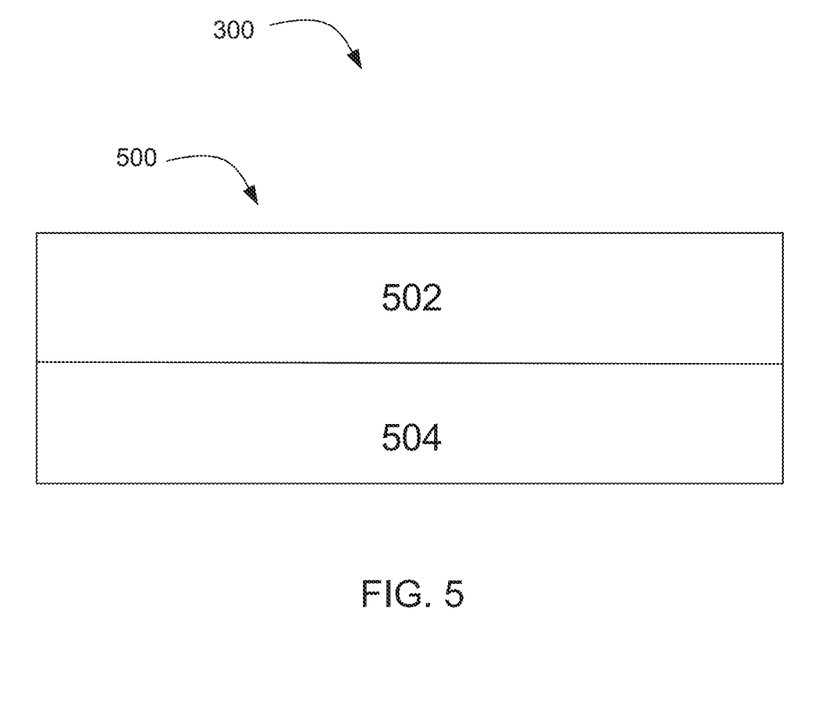
FIG. 5 schematically illustrates a tandem film in accordance with an example presented herein.

The methods described herein can be used to recrystallize films that have perovskite structures which can be used in a variety of applications. In one example these structures can be used for thin film transistors, LEDs, lasers, photovoltaic solar devices, photodiodes, radiation detectors, and the like. In some examples the method can be used to create a tandem device. More specifically, the method can further include forming a tandem device by combining the recrystallized film having a perovskite structure with a solar film to create a tandem device. Alternatively, the perovskite film can be initially formed on a solar device and subsequently subjected to the process described herein to reform the crystal film. An exemplary configuration is shown in FIG. 5. The tandem device 500 can include a film having a perovskite structure 502 and a solar film 504. The tandem device can exhibit increased performance when compared to either the film having the perovskite structure or the solar film, and the tandem device prior to recrystallization treatment. Such a tandem device can be used to improve the performance of a traditional solar cell. Thus has been presented a method of thermally induced recrystallization of a film having a perovskite structure.

EXAMPLES

Example 1—Thermally Induced Recrystallization of a Methylammonium Lead Triiodide Film Methylammonium lead triiodide (MAPbI$_3$) films were prepared on glass substrates via 1-step spin coating with an anti-solvent drip technique. The films were loaded into a sealed chamber at room temperature. The chamber was purged with nitrogen gas for 5 minutes. Following this, methylammonium gas was introduced in to the chamber by routing the nitrogen flow to a sealed 100 mL flask containing 5 mL of 33 wt. % solution of methylammonium in ethanol to carry the headspace gas in to the sealed chamber.

Figure 6:
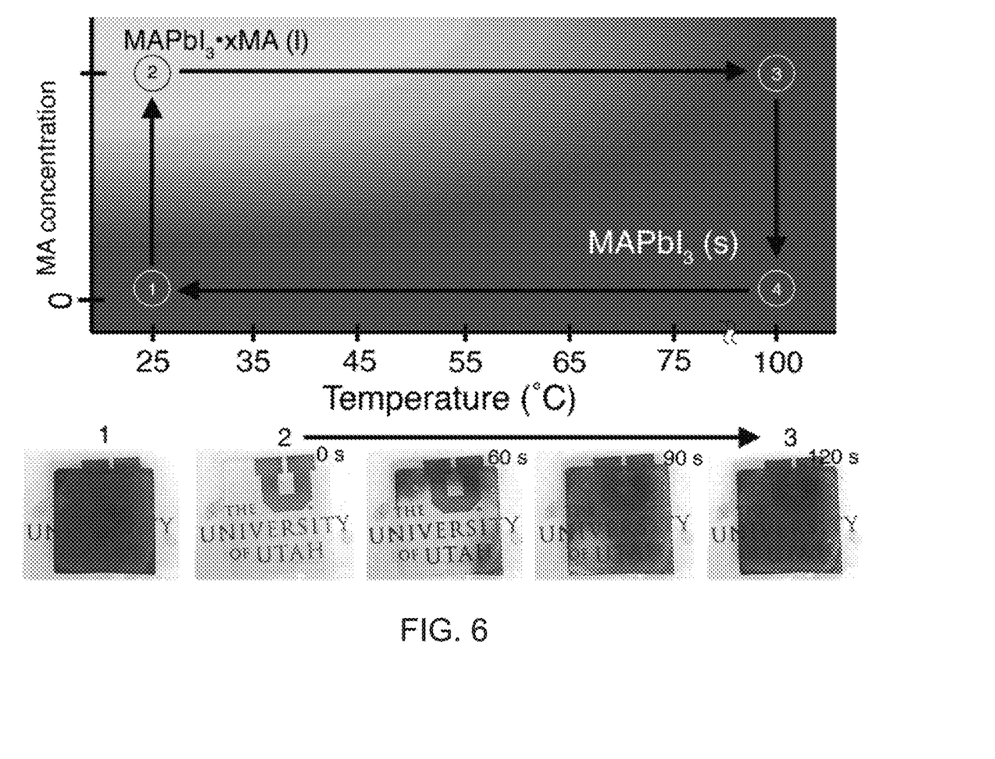
FIG. 6 displays images of seven crystalline perovskite structures exposed to either nitrogen gas or methylamine gas at different temperatures in accordance with one example presented herein.

Upon exposure of the films to the methylammonium gas the opaque dark brown MAPbI$_3$ films transitioned to a transparent colorless liquid state. FIG. 6 displays images of snapshots during the recrystallization process (pre- and post-methylammonium gas exposure and controls). Upon heating, the film in the methylammonium gas atmosphere began to recrystallize initially from the edges, followed by the massive crystal growth throughout the film until complete recrystallization occurred. When the recrystallization was complete the system was switched back to a nitrogen atmosphere and kept on the hot plate for 2 minutes at 100° C. Finally the chamber was removed from the hotplate and cooled to room temperature. No structural or morphological changes of the recrystallized MAPbI$_3$ films were observed during the nitrogen purge or cooling steps.

Figure 7A:
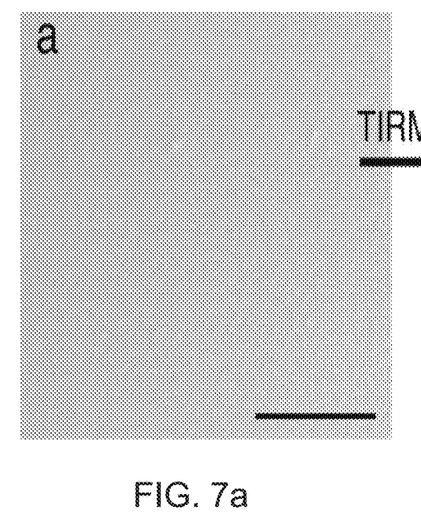
FIG. 7a displays an SEM image of pristine crystalline structure.
Figure 7B:
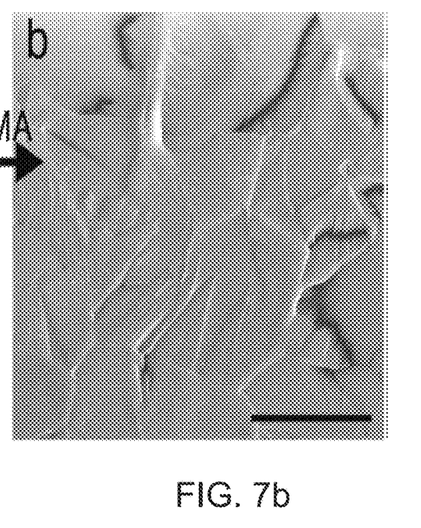
FIG. 7b displays an SEM image of a thermally induced recrystallized structure showing the formation of large crystalline grains in accordance with an example presented herein.
Figure 7C:
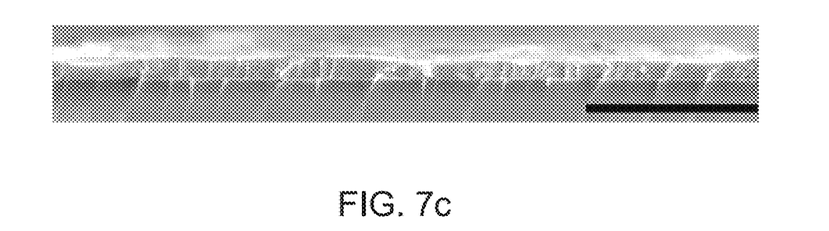
FIG. 7c displays a cross sectional SEM image of thermally induced recrystallized structure following treatment in accordance with an example presented herein.

The methylammonium gas exposed films resulted in films (hereinafter "treated film") having an increase in grain size of two orders of magnitude when compared to a pristine crystalline film. FIG. 7a displays an SEM image of a pristine crystalline film. FIG. 7b displays an SEM image of the treated film showing the formation of large crystalline grains. The treated film had crystals with an average grains size of about 15 µm. The SEM images further indicated that the treated film had a highly crystalline morphology with crystal twin boundaries. A cross-sectional SEM image of the treated film is shown in FIG. 7c (scale bar 3 µm). The cross-sectional SEM image indicates that the treated film did not exhibit significant pin-holing and had a uniform morphology through the thickness of the film.

Figure 7D:
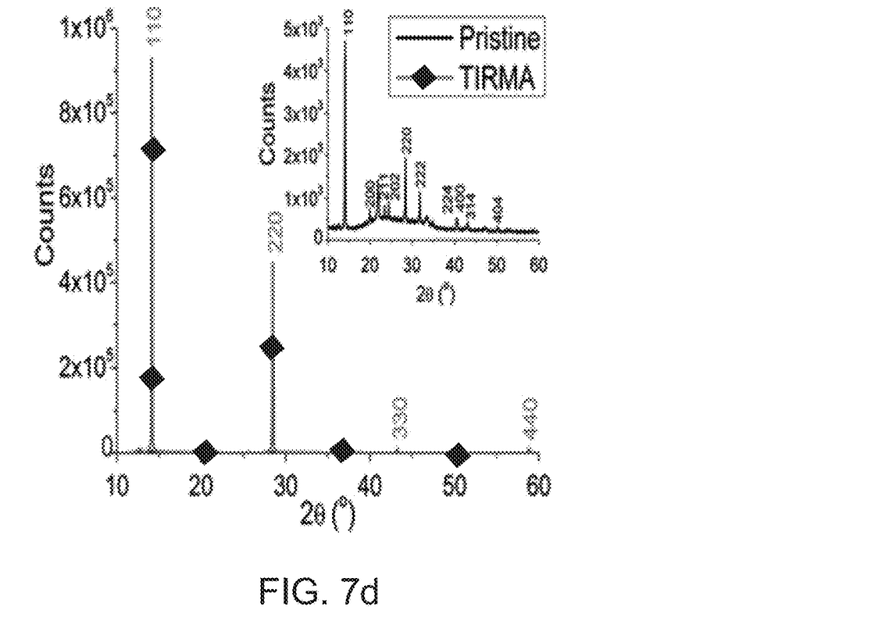
FIG. 7d displays an XRD spectra of the pristine crystalline structure and a thermally induced recrystallized structure in accordance with an example presented herein.

The pristine crystalline film and the treated film were further analyzed using X-ray diffraction. As shown in FIG. 7d the pristine crystalline film showed a mostly (110) lattice orientation with several minority orientations and the treated film showed an increase in peak intensity, over 2 orders of magnitude, with strong lattice orientation in the (110) direction. The full width half max of the (110) reflection at 14° decreased 36% from 0.106° to 0.068°, indicating an increase in grain size.

Figure 7E:
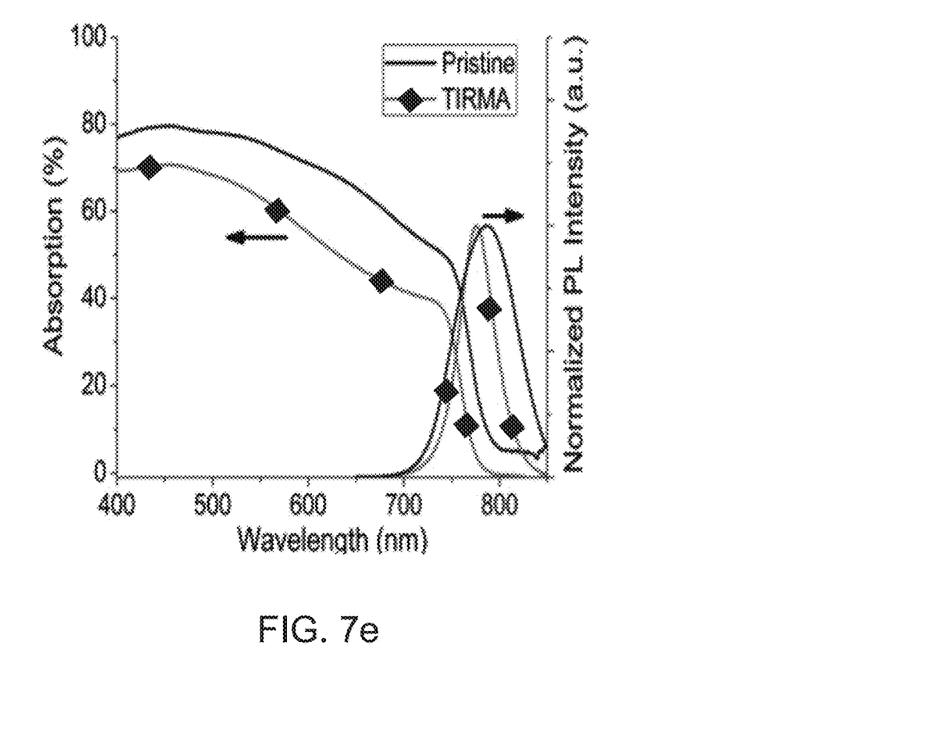
FIG. 7e displays absolute absorption and normalized photoluminescence spectra of a pristine crystalline structure and a thermally induced recrystallized structure in accordance with an example presented herein.

The pristine crystalline film and the treated film were further analyzed using photoluminescence spectral measurements. As can be seen in FIG. 7e the treated film showed a 10 nm blue shift of the PL peak from 785 to 775 and a decrease in full width half max from 74 nm to 46 nm indicating a reduction in low lying bulk and grain boundary defects. The PL peak shift was accompanied with a blue shift of the absorption band edge from 1.59 eV to 1.62 eV which converts to a about a 15 nm shift.

The pristine film contained crystals having grain sizes on the order of the wavelength of visible light and would be more efficient in scattering light within the film resulting in an increase in the optical path length. The treated film contained crystals having grain sizes over an order of magnitude larger than the wavelength of incident light, which should decrease light scattering and the path length of light within the film.

The enhancement in crystallinity was believed to be the result of slow growth controlled crystallization as opposed to fast nucleation driven process. When the temperature of the treated film reached ≥55° C. the colorless liquid phase began to show a darker yellow color, particularly at 55° C., 65° C., and 75° C. The yellow film was determined to be a liquid intermediate phase. When the temperature rose above the critical temperature, continued expulsion of the methylammonium molecules lead to supersaturation causing surface nucleation. Maintaining the constant elevated temperature throughout the process caused nuclei growth by continuous expulsion. The resultant film showed significantly enhanced crystallinity and reduced bulk crystal defects.

Example 2—Comparative Fast Annealing

For comparison a fast annealing technique in methylammonium vapor at room temperature was performed. A methylammonium lead triiodide (MAPbI$_3$) film was prepared on glass substrates via 1-step spin coating with an anti-solvent drip technique. The sample was then exposed to methylamine gas at room temperature for a period of about 1 second. The methylamine gas was removed and within 2 minutes the comparative treated film began to recrystallize. The recrystallization took about one second.

This treatment with the methylammonium gas did not result in any significant change in grain size when compared to the pristine sample but there was an observable morphology change in the comparative treated film. The comparative treated film had less defined and more distinct grain boundaries when compared to the pristine sample. This implies that the exposure to the methylammonium gas helps heal grain boundary defects. The full width half max of the comparative treated film was calculated to be 0.093° which was similar to the pristine film, indicating no significant change in crystal grain size. The UV-vis absorption and PL spectra showed a decrease in the full width half max to 48.5 nm and a blue shift in the absorption band edge to about 1.6 eV. While the comparative treated film showed some improvement the level of improvement was less than the improvement achieved by the treated film.

The foregoing detailed description describes the invention with reference to specific exemplary embodiments. However, it will be appreciated that various modifications and changes can be made without departing from the scope of the present invention as set forth in the appended claims. The detailed description and accompanying drawings are to be regarded as merely illustrative, rather than as restrictive, and all such modifications or changes, if any, are intended to fall within the scope of the present invention as described and set forth herein.

What is claimed is:

1. A method of thermally induced recrystallization of a film having a perovskite structure, comprising:
    exposing a substrate with a film having a perovskite structure to a gaseous liquid phase induction atmosphere sufficient to at least partially convert the film to a liquid phase, wherein the film has the formula ABX$_3$, (RA)$_2$A$_{n-1}$B$_n$X$_{3n+1}$, or (RA$_2$)A$_{n-1}$B$_n$X$_{3n+1}$ where A contains a monovalent cation, B is divalent metal cation, n is an integer, X is a halide ion, RA is an alkylammonium cation and RA$_2$ is an alkyldiammonium cation;
    heating the substrate with the film in the liquid phase while also in the gaseous atmosphere to a critical recrystallization temperature of the film until the film recrystallizes to reform the perovskite structure with reduced defects and increased grain size;
    purging the gaseous liquid phase induction atmosphere while maintaining a film temperature above the critical recrystallization temperature; and
    allowing the substrate with the film having the reformed perovskite structure to cool below the critical recrystallization temperature.

2. The method of claim 1, wherein the substrate is a member selected from the group consisting of a glass, treated glass, metal foil, polymer, ceramic, silicon solar cell, composites thereof, and combinations thereof.

3. The method of claim 1, wherein the substrate is a glass substrate.

4. The method of claim 1, wherein the film is a three-dimensional perovskite where A is a member selected from the group consisting of methylammonium (MA), Cesium (Cs), Formamadinium (FA), Rubidium (Rb), and mixtures thereof.

5. The method of claim 1, wherein the film is a two-dimensional perovskite where A is an alkylammonium cation.

6. The method of claim 5, wherein the alkylammonium cation is selected from the group consisting of Butylammonium (BA), phenylethylammonium (PEA), cyclopropylammonium (CA), and mixtures thereof, wherein the mixtures thereof are mixed Rudlesden-Popper 2D/3D phases of the form (RA)$_2$A$_{n-1}$B$_n$X$_{3n+1}$.

7. The method of claim 1, wherein the film is a two-dimensional perovskite where A is an alkyldiammonium cation.

8. The method of claim 7, wherein the alkyldiammonium cation is selected from the group consisting of butyldiammonium (BA$_2$), hexyldiammonium (HA$_2$), octyldiamonium (OA$_2$), dodecanediammonium (DDA$_2$), and mixtures thereof, wherein the mixtures thereof are Ruddlesden-Popper 2D/3D mixtures of the form (RA$_2$)A$_{n-1}$M$_n$X$_{3n+1}$.

9. The method of claim 1, wherein the B is a member selected from the group consisting of lead (Pb), tin (Sn), bismuth (Bi), antimony (Sb), silver (Ag), strontium (Sr), calcium (Ca), cadmium (Cd), magnesium (Mg), manganese (Mn), nickel (Ni), and combinations thereof.

10. The method of claim 1, wherein the X is a member selected from the group consisting of iodide (I), bromide (Br), chloride (Cl), pseudohalide thiocyanate (SCN), Fluoride (F), and combinations thereof.

11. The method of claim 1, wherein the atmosphere comprises a member selected from the group consisting of methylamine, Cesium, Rubidium, Formamidine (FA), alkylamines, alkyldiamines, primary amine, and combinations thereof.

12. The method of claim 1, wherein an exposure period for the atmosphere prior to heating ranges from 5 seconds to 5 minutes.

13. The method of claim 1, wherein the critical recrystallization temperature is at least 30° C.

14. The method of claim 1, wherein the atmosphere includes a liquid phase inducing compound which produces a cation having the same composition as A.

15. The method of claim 1, wherein the atmosphere excludes a liquid phase inducing compound which produces A.

16. The method of claim 15, wherein the atmosphere includes a liquid phase inducing compound which produces a cation which replaces at least a portion of A in the film having the perovskite structure.

17. The method of claim 1, wherein the atmosphere further includes a defect passivating agent.

18. The method of claim 17, wherein the defect passivating agent is selected from the group consisting of fullerene, thiophene, pyridine, trioctylphosphine oxide, octadecanethiol, triphenylphosphine, hypophosphorous acid, aluminum ($Al^{3+}$), copper ($Cu^{1+}$), silver ($Ag^{1+}$), sodium ($Na^{1+}$), potassium ($K^{1+}$), and combinations thereof.

19. The method of claim 1, wherein the film having the perovskite structure is methylammonium lead triiodide ($MAPbI_3$) and wherein the atmosphere comprises methylamine.

20. The method of claim 1, further comprising purging oxygen from the atmosphere prior to the exposing of the substrate with the film having the perovskite structure to the atmosphere.

21. The method of claim 1, further comprising forming a tandem device where the film having the perovskite structure is adjacent to a solar film.

* * * * *